US006903556B2

(12) United States Patent
Sutton

(10) Patent No.: US 6,903,556 B2
(45) Date of Patent: Jun. 7, 2005

(54) METHOD AND APPARATUS FOR TESTING LAMINATED CORES OF ELECTRICAL MACHINES

(75) Inventor: John Sutton, Surrey (GB)

(73) Assignee: Adwel International Limited, Hertfordshire (GB)

( * ) Notice: Subject to any disclaimer, the term of this patent is extended or adjusted under 35 U.S.C. 154(b) by 41 days.

(21) Appl. No.: 10/308,895

(22) Filed: Dec. 3, 2002

(65) Prior Publication Data

US 2003/0117144 A1 Jun. 26, 2003

(30) Foreign Application Priority Data

Dec. 4, 2001 (GB) .............................. 0129020

(51) Int. Cl.$^7$ ..................... G01R 31/06; G01R 31/34; G01B 7/06
(52) U.S. Cl. ..................... 324/546; 324/772; 324/230
(58) Field of Search ................... 324/545, 546, 324/772, 228, 233, 230, 240, 76.78; 318/490

(56) References Cited

U.S. PATENT DOCUMENTS

| | | | | |
|---|---|---|---|---|
| 4,654,585 A | * | 3/1987 | Yagi ..................... 324/76.78 |
| 4,803,563 A | * | 2/1989 | Dailey et al. ............... 348/83 |
| 4,996,486 A | * | 2/1991 | Posedel ..................... 324/545 |
| 5,990,688 A | * | 11/1999 | Bourgeois et al. .......... 324/545 |
| 6,064,172 A | * | 5/2000 | Kuznetsov ................. 318/716 |
| 6,459,276 B1 | * | 10/2002 | Matthews et al. ........... 324/545 |
| 6,469,504 B1 | | 10/2002 | Kliman et al. ............... 324/228 |

FOREIGN PATENT DOCUMENTS

| AT | 390 522 B | 5/1990 |
|---|---|---|
| GB | 2 044 936 A | 8/1979 |
| WO | WO 02/10737 A2 | 2/2002 |

OTHER PUBLICATIONS

Ridley, "EL CID test evaluation, 1994–96" (IEE Power Engineering Journal, vol. 11, issue 1, 1997, pp. 21–26).*
Lee et al. "An advanced technique for detecting inter–laminar stator core faults in large electric machines" (IEEE Industrial Applications Conference, 2003. 38th IAS Annual Meeting, vol. 2, Oct. 12–16, 2003).*
Ridley, G. K., "EL CID Application Phenomena", $6^{th}$ IEE International Conference on Electrical Machines & Drives Proceedings, pp. 491–498, Sep. 1993.
Paley, D. B., "Current Low Power Core Testing Using EL CID", IEE Colloquium—Understanding your condition monitoring, Apr. 1999.
Ridley, G. K., "Why, when and how to apply EL CID to hydro generators", Modelling, Testing & Monitoring, for Hydro Poweplants—II, The International Journal on Hydropower & Dams, 1996.
Ridley, G. K., "Conducting an EL CID test on a hydro generator", Hydropower & Dams, Nov. 1994.

* cited by examiner

Primary Examiner—Anjan K. Deb
(74) Attorney, Agent, or Firm—Westman, Champlin & Kelly, P.A.

(57) ABSTRACT

There is provided an apparatus and associated method for the testing of a laminated core (100) for an electrical machine. The apparatus supplies an excitation signal to the winding (102) of the electrical machine which is of a frequency higher than the rated operating frequency of the machine. There is also provided a phase sensitive detector (110) which receives, from the laminated core (100), a signal in response to the excitation signal. The phase sensitive detector (110) resolves the received signal into a number of components. These components are resolved relative to a reference signal. The size of the components determines the severity of any fault that exists within the laminated core (100.

32 Claims, 2 Drawing Sheets

SCHEMATIC OF PRESENT ELCID TEST CONFIGURATION

SCHEMATIC OF NEW HIGH FREQUENCY ELCID TEST CONFIGURATION

METHOD AND APPARATUS FOR TESTING LAMINATED CORES OF ELECTRICAL MACHINES

BACKGROUND TO THE INVENTION

The present application claims priority of United Kingdom Patent Application Serial No. 0129020.4, filed 4 Dec. 2001, the contents which are hereby incorporated hereby in its entirety.

The present invention relates to the testing of a laminated core of an electrical machine.

The stator cores of generators and other electrical machines are built up of thin steel laminations which are each coated with a layer of electrical insulation. This insulation prevents the alternating magnetic flux, through the core, inducing unwanted eddy currents between the laminations.

The lamination insulation may, however, become damaged during assembly or maintenance of a stator, particularly during removal or replacement of the rotor. The insulation may also degrade during operation, due to, for example, wear of the insulation.

If the insulation becomes damaged, then conducting circuits may be formed between laminations, through which fault currents are induced by the alternating magnetic flux. These damaged regions may become hot in service and are referred to as hot spots. These hot spots may damage the insulation on adjacent sections of the stator and can cause electrical breakdown and failure of the machine.

There have been several techniques developed to identify damaged insulation and so allow repair to reduce the severity of the hot spots. One such test involves generating a large (around 80% of the normal operating value) magnetic ring flux around the stator core. This heats the hot spot allowing infra red equipment to locate the position of the hot spot. This type of test however requires a large amount of power and may not be able to detect deep seated core damage. Additionally, these tests are labour intensive as the excitation windings are large. This in turn has prevented the tests being carried out with the rotor in situ. Other tests have therefore been developed to mitigate these problems. Two examples using different techniques now follow.

A local excitation test is described in U.S. Pat No. 5,990,688. This uses a test head that is a C shaped section of laminated steel held against the stator teeth which locally excites the core. Using this test, only a low excitation flux is required to be generated in the stator. This means that a small amount of power is required to conduct this test. The test is also simple to set up as the test head need only be held against the stator teeth.

However, the test head is relatively large and heavy. This means that the test head cannot traverse the stator core very easily. Additionally, the test may not enable hot spots to be located precisely and so repairing the laminations may be difficult.

A second example is the Electromagnetic Core Imperfection Detector (ElCID) test. This test is described in GB-A-2 044 936 and requires that a low ring flux is generated around the stator core (typically only 4% of the normal operating value). This ring flux is produced by an excitation winding through the bore of the stator core. The ring flux induces fault currents in the stator core that flow through any potential hot spots, but these fault currents are too small to cause any detectable heating. Instead the current flowing through the fault is detected electromagnetically using a special pick-up coil such as, for example, a Chattock Potentiometer. Such coils also detect the magnetic fields produced by the excitation current that is typically much larger than those produced by the fault currents. The fault current tends to be in phase quadrature with the excitation current and so by identifying and measuring the component of the detected current that is in phase quadrature with the excitation current, a fault current can be quantified allowing the severity of the fault to be determined quickly, without the use of large number of personnel. Also it is possible, using ElCID, to locate the position of the fault, facilitating repair as well as providing a permanent record of the fault severity thereby allowing the effectiveness of the repair to be quickly assessed. ElCID testing is now common in the electrical power industries and is widely accepted as a reliable core testing method.

However there are several situations in which it is difficult to obtain reliable results using ElCID testing. These include testing of stators with rotors in situ and the testing of certain areas of hydrogenerator cores.

Rotor in situ testing is reasonably common in hydrogenerators as there is often sufficient access to test the stator bore, without major disassembly of the machine. There can however be difficulties because the current through the excitation winding induces eddy currents in solid steel components such as the rotor and rotor bearings. These eddy currents produce magnetic fields at the tips of the stator teeth that are not in phase with the excitation current and so can affect the ElCID test results such that faults are difficult to identify.

Many hydrogenerators are made up of split cores, where the core comes in two or more sectors which are assembled on site. Inevitably there are small gaps at the joins between the sectors of the laminated core. The ring flux around the core generates very large magnetic fields as it crosses the gaps and so increases the magnetic field at the stator teeth near the gap. The amplitude and phase of these fields vary along the length of the gap and the amplitude of these fields can be much greater than (typically 100 times greater than) those produced by a fault current. Since the phase and amplitude of these magnetic fields are not well defined it becomes very difficult using the standard ElCID test to determine whether there is a genuine fault in the core near the joins. This is a serious drawback as damage is likely to occur at the joins in the core.

It is an object of the present invention to address these problems.

SUMMARY OF THE INVENTION

According to one aspect of the present invention there is provided apparatus for testing a laminated core of an electrical machine, the apparatus comprising excitation signal generating means, arranged to generate an excitation signal at a first frequency which is higher than the rated operating frequency of said electrical machine, for supply to an excitation winding coupled to the laminated core of the electrical machine, and a phase sensitive detector arranged to receive a first, reference signal having a reference phase and to receive from the laminated core of the electrical machine a second, test signal having a test amplitude and phase, each in response to the excitation signal applied to the excitation winding, the phase sensitive detector being arranged to resolve the test signal into a plurality of components relative to said reference phase of said reference signal and to generate an output signal, the level of such signal being indicative of the severity of a fault between the laminations of said laminated core.

The present invention overcomes the problem experienced by traditional ElCID testing apparatus when testing split hydrogenerator cores by operating at higher frequencies because smaller magnetic fields are generated by the excitation current near the stator teeth. By increasing the frequency of the excitation signal, the current required to produce a given electric field along the stator core is reduced. This means that the large Magnetic Potential Difference (MPDs) across any gaps and between the stator teeth are also reduced. Therefore, as the current through a fault is primarily determined by the level of the electric field and by the resistance of the fault, the fault currents in the stator core near the gaps are detected more reliably because the level of the unwanted magnetic field is reduced. Also the present invention reduces eddy current flow within the solid metal components associated with many electrical machines, for example, the rotor and its bearings, and so reduces the quadrature magnetic fields generated at and near the stator teeth. This is because the amplitude of the eddy currents are proportional to the amplitude of the excitation current and both the amplitude and phase-shift of the external magnetic fields produced by the eddy currents tend to be independent of frequency. This increases the resolution and accuracy of the results.

It is preferable that the in phase and phase quadrature components of the test signal, relative to the reference signal, are used as an indication as to the severity of the fault. However, it is to be anticipated that either the substantially in phase or phase quadrature component can equally be used individually.

To optimise the effectiveness of the test it is preferable that the stator core is energised to between 0.01% and 5% of the rated operating electric field.

In a further embodiment of the present invention there is provided apparatus wherein said excitation signal generating means comprises a frequency generator, arranged to generate at least one further excitation signal having a respective frequency that is higher than the rated operating frequency of said electrical machine.

This is advantageous because one of the frequencies may typically be close to the optimum frequency. Another advantage is that it may be possible to analyse these signals to derive the effective resistance and inductance of the fault circuit at each frequency. These resistance and inductance values for the various frequencies may be then extrapolated back down to the rated operating frequency (usually 50 or 60 Hz), or even to DC, better to characterise the severity of the fault.

In a further embodiment of the present invention there is provided a system for testing laminated cores in electrical machines comprising-the testing apparatus of the present invention coupled to an excitation winding.

In a second aspect of the present invention there is provided a method for testing a laminated core of an electrical machine, comprising the steps of:
generating an excitation signal at a first frequency, wherein the first frequency is higher than the rated operating frequency of said electrical machine;
receiving a first, reference signal having a reference amplitude and phase and a second, test signal having a test phase, each signal generated in response to the excitation signal applied to the excitation winding;
resolving the test signal into a plurality of components with respect to the reference phase of the reference signal; and
generating an output signal, the level of said output signal being indicative of the severity of a fault between the laminations of said laminated core.

BRIEF DESCRIPTION OF DRAWINGS

One embodiment of the present invention will now be described by way of example only and with reference to the following drawings in which.

DETAILED DESCRIPTION OF THE PREFERRED EMBODIMENT

Figure 1:
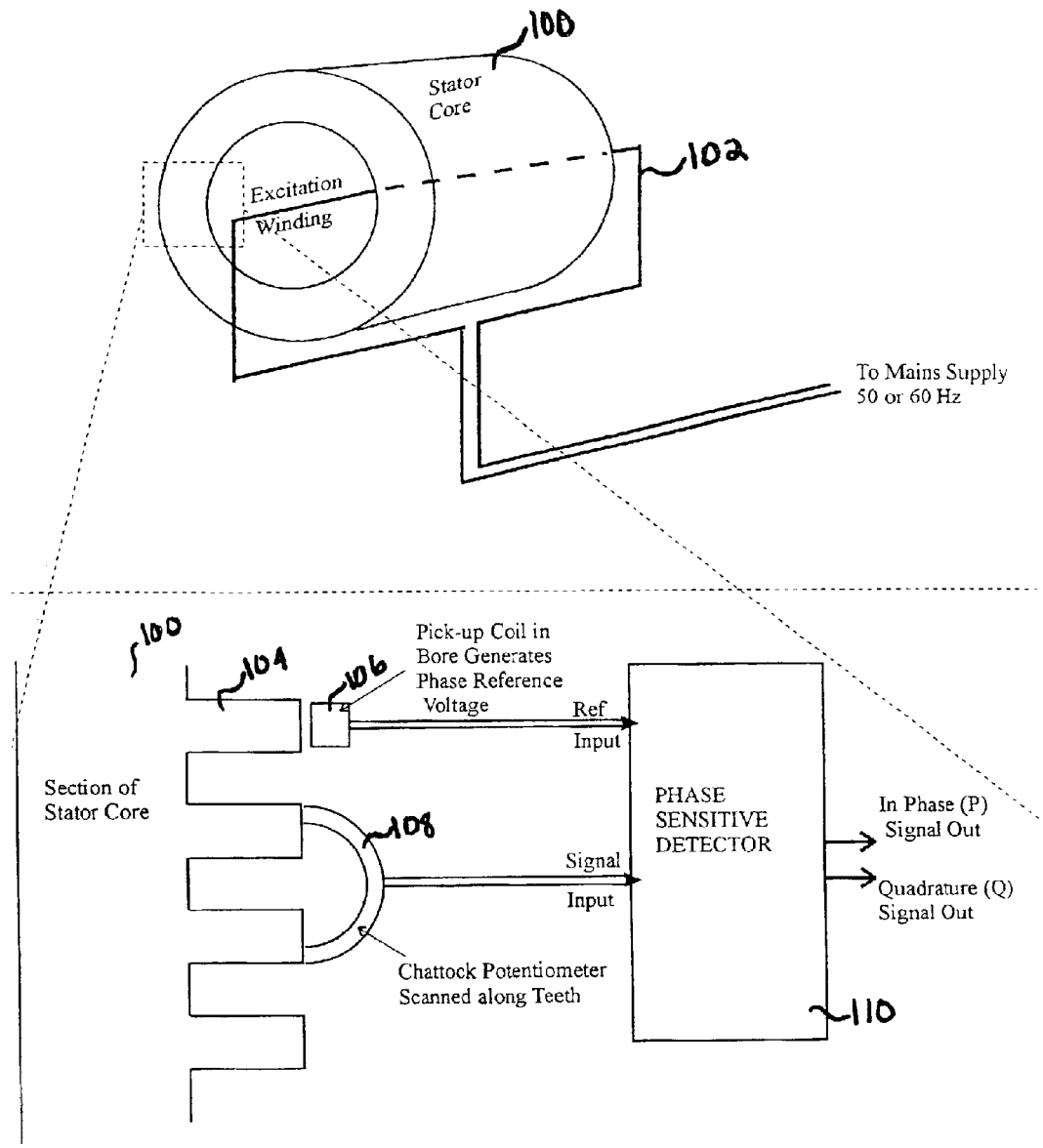
FIG. 1 shows a schematic diagram of a known configuration of equipment for an Electromagnetic Core Imperfection Detector (ElCID) test.

FIG. 1 shows a schematic of a typical known Electromagnetic Core Imperfection Detection (ElCID) test arrangement. This particular ElCID arrangement includes a laminated stator core 100. The stator core 100 is made up of layers of thin steel and insulation as is known. In large turbogenerators and some hydrogenerators, the stator core 100 is built up from layers of laminations which overlap all around the core. Many large hydrogenerator cores, however, are formed from two or more sectors, each built up from overlapping laminations, and the sectors are assembled on site. Small gaps therefore occur between where the sectors are joined. In use, a rotor (not shown) passes through the centre of the core 100. Typically during test, however, the rotor may be removed and an inserted excitation winding 102 passes through the centre of the core 100. However, as noted previously the stator 100 may be tested whilst the rotor is in place. It is also to be noted that key bars (not shown) which traverse the length of the exterior wall of the stator core 100 may allow a conductive path to be formed between the laminations at the exterior wall.

The stator core 100 has stator teeth 104 around its inner core wall to house the stator windings. The stator teeth 104 are spaced evenly about the inner wall and are directed radially inwards towards the axis of the core.

As is indicated in FIG. 1, the excitation winding is connected to a power source (not shown). The power source operates at the rated operating frequency of the stator core 100 under test. Typically this frequency is 50 or 60 Hz depending on the stator core 100.

Also the power supply (not shown) is arranged so that it provides to the excitation winding 102 sufficient current so as to induce in the stator core 100 a magnetic "ring" flux density of typically 4% of the rated operating magnetic flux density. This circumferential flux around the core 100 induces an electric field along the core 100. This induced electric field is typically 4% of the rated electric field of the stator core 100. For a large turbogenerator, the total Magneto Motive Force (MMF) required in the excitation winding 102 is typically 60 Ampere-turns and is about 250 Ampere-turns for a large hydrogenerator.

If the stator core 100 is fault free and there are no gaps around the core nor any solid metal in the vicinity, the MMF from the excitation winding 102 is fairly uniformly distributed around the core. The Magnetic Potential Difference (MPD) between each adjacent stator tooth 104 is then roughly equal to the total excitation MMF divided by the number of stator teeth 104. Therefore, for a typical large turbogenerator having 60 teeth and requiring an MMF of 60 Ampere-turns, the MPD between adjacent teeth is about 1 Ampere.

If the stator core 100 is damaged, this may lead to catastrophic failure of the electrical machine in service as described in the introduction. In a damaged section of core, a fault current will flow between laminations, a typical closed circuit being formed by localised damage to the insulation on a group of laminations and by the electrical contact to the key bars at the back of the core. In an ELCID test, a fault current is also induced in such a circuit by the electric field generated by the excitation current. The amplitude of the current flowing through such a fault is usually much less than the MPD between adjacent stator teeth 104 produced by the excitation current. The fault current will however be predominantly in phase with the electric field along the core and therefore in phase quadrature with the excitation current. The total MPD between adjacent stator teeth 104 is the resultant of the component from the excitation current and the component from the fault current and the fault current, although small, is readily detected by measuring the component that is in phase quadrature with the excitation current. In the ElCID test, this phase quadrature component of the MPD is measured and used to detect faults and to quantify their severity.

Referring back to FIG. 1, as is known in the ElCID test, a Chattock Potentiometer 108 is placed over, in this case, two consecutive stator teeth 104. The output voltage from the Chattock Potentiometer 108 is proportional to the line integral of the magnetic field along its length i.e. to the MPD between its ends. This characteristic of the Chattock Potentiometer 108 makes it suitable for ElCID tests although other types of pick up coil or magnetic field sensor, such as those using the Hall Effect or magneto-resistance devices may be employed instead.

It may be advantageous to place the Chattock Potentiometer 106 across more than two teeth 104. More specifically, the Chattock Potentiometer 108 is typically arranged so that the ends of the Chattock Potentiometer 108 are placed over the farthest corners of two adjacent stator teeth 104. The ends of the Chattock Potentiometer 108 are typically in contact with the stator teeth 104 although the ends may be placed just above the stator teeth 104.

The output voltages of the reference coil 106 and the Chattock Potentiometer 108 are fed to a phase sensitive detector 110. The reference coil 106 is placed in the stator bore so that the phase of its output voltage is determined by the phase of the magnetic flux in the stator bore that is generated by the excitation current.

The output voltage and the reference voltage are input to the phase sensitive detector 110. The phase sensitive detector 110 is arranged to output two signals. One of the output signals is proportional to the component of the MPD, measured by the Chattock Potentiometer 108, that is in phase with the excitation current and the second output signal is proportional to the MPD that is substantially in phase quadrature with the excitation current. As noted earlier, the phase quadrature component indicates a fault current.

The phase sensitive detector 110 is known and so will therefore not be explained in any further detail.

In test, the Chattock Potentiometer 108 is placed to span across two consecutive stator teeth 104. The Chattock Potentiometer 108 then traverses the stator core 100. As the Chattock Potentiometer 108 transverses the stator core 100, both the in-phase and phase quadrature components are recorded or displayed as a function of distance along the core 100. The in phase component and the phase quadrature component are therefore output to a recording device or may be displayed instead. This recording device may be a chart recorder, a computer or the like.

At the end of each scan, the Chattock Potentiometer 108 is repositioned so as to span across the next adjacent pair of stator teeth 104 which are then scanned and the two output signals recorded. This process is repeated until the whole stator core 100 has been tested.

If the phase quadrature component exceeds a certain threshold, typically 100 mA, then a significant fault current is deemed to be flowing at that point and more detailed analysis of the local area may take place. Such analysis may include using a smaller Chattock Potentiometer or the like to probe the locality.

Figure 2:
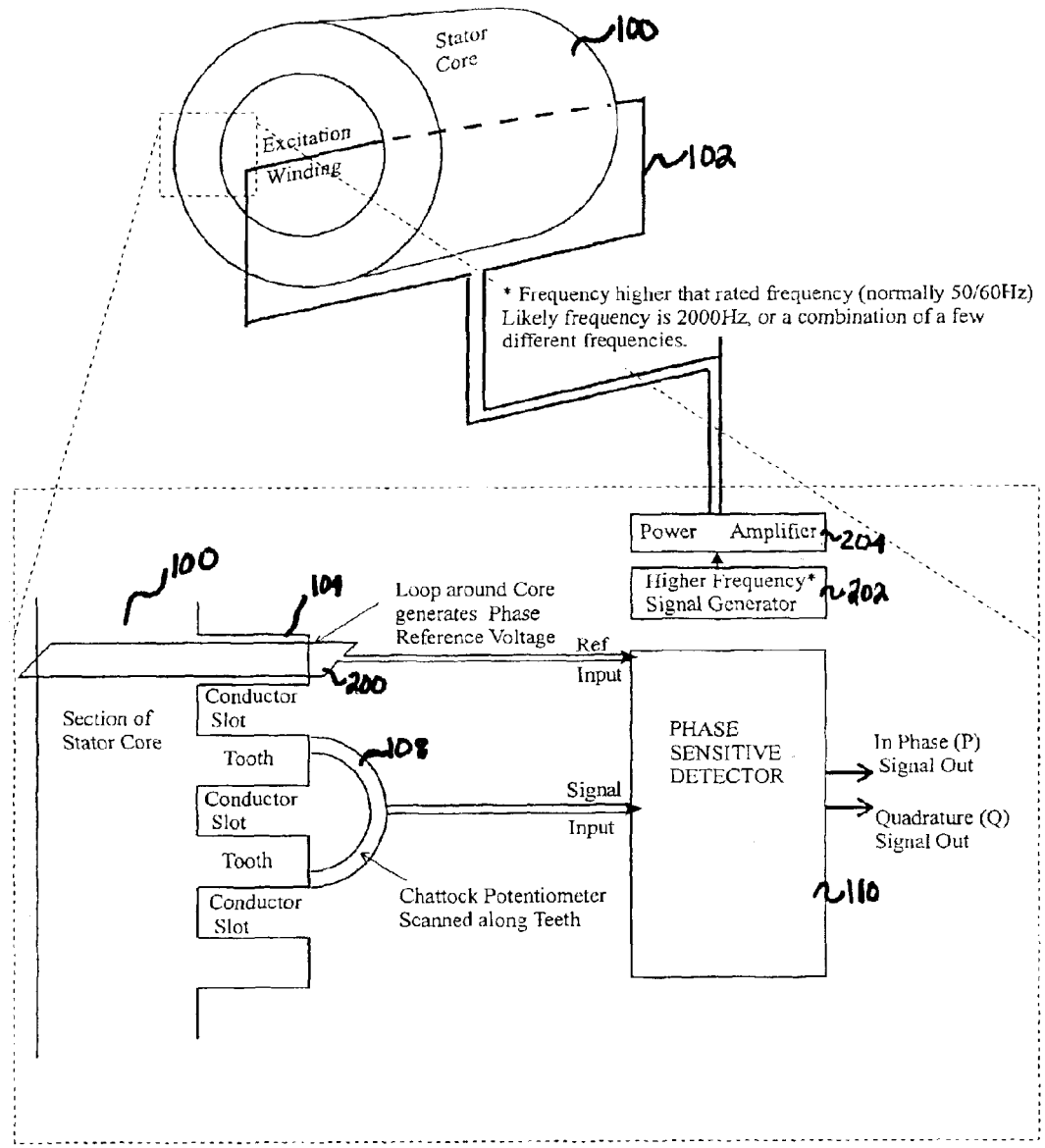
FIG. 2 shows a schematic diagram of a system for testing laminated cores which embodies the present invention.

Referring now to FIG. 2, a schematic drawing of a test apparatus is shown which embodies the present invention. The arrangement of FIG. 2 also shows a known Chattock Potentiometer 108, a stator core 100 under test, an excitation winding 102 and a phase sensitive detector 110.

The excitation winding 102 passes through the bore of the stator core 100; as with the arrangement of FIG. 1 above, the rotor has been removed prior to test. It should be noted however, that the rotor does not have to be removed before test. The excitation winding 102 is connected to a high frequency power amplifier 204. Also connected to the high frequency power amplifier 204 is a signal generator 202.

The signal generator 202 outputs a single, high frequency signal to the power amplifier 204 which amplifies this generated signal to provide the current to the excitation winding 102.

The generated signal frequency exceeds the rated operating frequency of the stator core 100. In this particular case, the generated signal will have a frequency of around 2 kHz. Other suitable frequencies that may be generated also include 500 Hz, 1 kHz, and 5 kHz although frequencies above and below these values may also be suitable.

The phase sensitive detector 110 is also connected to the Chattock potentiometer 108 and a reference phase sensor 200.

In test, the high frequency signal generator 202 generates, in this case, a 2 kHz sinusoidal signal. This signal is amplified by the power amplifier 204 to supply current to the excitation winding 102. The current output from the power amplifier is typically such that the stator core 100 is energised to only 0.01% to 5% of the rated operating electric field and may therefore be much less than in the known ElCID test where 4% of the rated operating electric field is used, as described above.

In this case, the reference phase sensor 200 is a wire loop around the stator core 100. More specifically, the wire loop is a single loop that traverses the length of the stator core 100 along the inward face of one of the stator teeth 104, the outside length of the stator core 100 and along both faces of the stator core 100. The reference phase sensor 200, in this case, measures the phase of the magnetic flux in the stator core 100 and so therefore a voltage signal representing the phase of the magnetic flux is input into the phase sensitive detector 110. As the frequency of the excitation current is higher than the rated operating frequency, of the stator core 100, the phase of the magnetic flux in the stator core 100 is substantially different from that of the magnetic flux in the stator bore. This is due to the skin effect as explained below.

As the frequency of the excitation current increases above the rated operating frequency of the stator core 100, the magnetic flux is attenuated within the thickness of the laminations which make up the stator core 100. This is because the laminations are designed to operate at a rated lower frequency, therefore the thickness of the laminations (determined by the manufacturer of the stator core 100), is dependent upon the operating frequency. As the frequency of the excitation signal increases beyond this rated operating frequency, the skin depth (the depth to which the excitation signal will penetrate) reduces. This means that it can no longer be assumed that the phase of magnetic flux within the stator bore produced by the excitation current is almost identical to the phase of the magnetic flux in the stator core 100, as is the case in the prior art of FIG. 1. The reference coil 106 as described in relation to FIG. 1 can therefore not be used in the test of the present invention without modification to the system.

As an alternative, the reference phase signal for the phase sensitive detector 110 may be generated by other means. For example from a reference coil 106 in the stator bore or from a direct link to the high frequency signal generator 202. In both these alternative cases however, the phase of the voltage input to the phase sensitive detector 110 is adjusted electronically within the phase sensitive detector 110 so that the resultant reference voltage is of a similar phase to that as would be produced by the wire loop arrangement described in relation to FIG. 2. The phase is adjusted so that the phase quadrature output signal from the phase sensitive detector 110 is substantially zero when the Chattock Potentiometer is positioned over a section of the stator core 100 which is known to be undamaged, or a simulation of such a section.

To test a stator core 100 the Chattock Potentiometer 108 is arranged and scanned along the stator teeth 104 as previously described. Both the reference phase sensor 200 and the Chattock Potentiometer 108 are in communication with the phase sensitive detector 110. The phase sensitive detector 110 is arranged as previously described with an in phase signal output and a phase quadrature output. Both the in-phase and the phase quadrature output signals from the phase sensitive detector 110 lead to an indicating device which may be an chart recorder, a computer or the like which records the output signals as a function of position along the stator teeth 104 as previously described.

Other modifications are contemplated to the described embodiment. For example, the signal generator 202 may be capable of generating a number of different frequency signals simultaneously. If several frequencies are generated simultaneously the phase sensitive detector 110 will output several pairs of in-phase and phase-quadrature signals, one pair for each different frequency. The results from the phase sensitive detector 110 may be used to calculate the effective resistance and inductance of the fault current circuit at each frequency. These results can be extrapolated back to determine the value of the resistance and inductance at the rated frequency, usually 50 Hz or lower, for example, D.C.

I claim:

1. Apparatus for testing a laminated core of an electrical machine, the apparatus comprising:

excitation signal generating means, arranged to generate an excitation signal at a first frequency which is higher than the rated operating frequency of said electrical machine, for supply to an excitation winding coupled to the laminated core of the electrical machine; and a phase sensitive detector arranged to receive a first, reference signal having a reference phase and to receive from the laminated core of the electrical machine a second, test signal having a test amplitude and phase, each in response to the excitation signal applied to the excitation winding, the phase sensitive detector being arranged to resolve the test signal into a plurality of components relative to said reference phase of said reference signal and to generate an output signal, the level of said output signal being indicative of the severity of a fault between the laminations of said laminated core.

2. Apparatus as claimed claim 1, wherein the phase sensitive detector is arranged to generate in phase and phase quadrature components, relative to the reference signal, of the test phase signal.

3. Apparatus as claimed in claim 2, wherein the output indication of the fault is determined by both the quadrature component and the in phase component.

4. Apparatus as claimed in claim 2, wherein the said output indication of said fault is determined by said quadrature component.

5. Apparatus as claimed in claim 1, wherein said excitation generating means further comprises a power amplifier arranged to generate the first excitation signal such that the corresponding first excitation electric field induced in the stator core under test is maintained at a predetermined level.

6. Apparatus as claimed in claim 5, wherein said level is between 0.01% and 5% of the rated operating electric field of the electrical machine.

7. Apparatus as claimed in claim 1, wherein said reference signal is received from the laminated core of the said electrical machine.

8. A system for testing laminated cores in electrical machines comprising:

the testing apparatus as claimed in claim 1 coupled to an excitation winding.

9. A system for testing as claimed in claim 8, wherein said electrical machine is a hydrogenerator.

10. A system for testing as claimed in claim 8, in which the testing apparatus is coupled to a test signal sensor.

11. A system for testing as claimed in claim 10, wherein said test signal sensor is a Chattock Potentiometer arranged adjacent to the stator of the electrical machine so as to generate the said test signal in accordance with the magnetic potential difference between two ends of the said Chattock Potentiometer.

12. A system as claimed in claim 8 in which the testing apparatus is coupled to a reference signal sensing means arranged to generate a reference signal having a reference phase.

13. A system as claimed in claim 12, wherein said reference signal sensing means is a wire loop coupled around the stator of the electrical machine.

14. Apparatus for testing a laminated core of an electrical machine, the apparatus comprising:

excitation signal generating means, arranged to generate an excitation signal at a first frequency which is higher than the rated operating frequency of said electrical machine, for supply to an excitation winding coupled to the laminated core of the electrical machine;

a phase sensitive detector arranged to-receive a first, reference signal having a reference phase and to receive from the laminated core of the electrical machine a second, test signal having a test amplitude and phase, each in response to the excitation signal applied to the excitation winding, the phase sensitive detector being arranged to resolve the test signal into a plurality of components relative to said reference phase of said reference signal and to generate an output signal, the level of said output signal being indicative of the severity of a fault between the laminations of said laminated core; and a frequency generator, arranged to generate at least one further excitation signal having a respective frequency that is higher than the rated operating frequency of said electrical machine.

15. Apparatus as claimed in claim 14, wherein the or each further excitation signal has a different frequency to the first excitation signal.

16. Apparatus as claimed in claim 15, wherein the or each further excitation signal has a different amplitude to the first excitation signal.

17. Apparatus as claimed in claim 15, wherein the said phase sensitive detector is arranged to analyse the or each of said first and further excitation signals at substantially the same time.

18. Apparatus as claimed in claim 14, wherein said excitation generating means further comprises a power amplifier arranged to generate the or each of said at least one further excitation signal such that the corresponding at least one further excitation electric field is maintained at a predetermined level.

19. Apparatus as claimed in claim 14, wherein said frequency generator is operable to generate a variable frequency excitation signal or signals.

20. A method for testing a laminated core of an electrical machine, comprising the steps of:

generating an excitation signal at a first frequency, wherein the first frequency is higher than the rated operating frequency of said electrical machine;

receiving a first, reference signal having a reference phase and a second, test signal having a test amplitude and phase, each signal generated in response to the excitation signal applied to the excitation winding;

resolving the test signal into a plurality of components with respect to the reference phase of the reference signal; and generating an output signal, the level of said output signal being indicative of the severity of a fault between the laminations of said laminated core.

21. A method as claimed in claim 20, further including the step of generating in phase and phase quadrature components of the test signal, relative to the reference signal, of the test phase signal.

22. A method as claimed in claim 21, wherein the output indication of the fault is determined by both the quadrature component and the in phase component.

23. A method as claimed in claim 21, wherein the said output indication of said fault is determined by said quadrature component.

24. A method as claimed in claim 20, further comprising the step of arranging a power amplifier to control the first excitation signal in such a way that the corresponding first excitation electric field induced in the stator core under test is maintained at a predetermined level.

25. A method as claimed in claim 24, wherein said level is between 0.01–5% of the rated operating electric field of the electrical machine.

26. A method as claimed in claim 20, wherein said reference signal is received from the laminated core of said electrical machine.

27. A method for testing a laminated core of an electrical machine, comprising:

generating an excitation signal at a first frequency, wherein the first frequency is higher than the rated operating frequency of said electrical machine;

receiving a first, reference signal having a reference phase and a second, test signal having a test amplitude and phase, each signal generated in response to the excitation signal applied to the excitation winding;

resolving the test signal into a plurality of components with respect to the reference phase of the reference signal;

generating an output signal, the level of said output signal being indicative of the severity of a fault between the laminations of said laminated core; and generating at least one further excitation signal, having a respective frequency that is higher than the rated operating frequency of said electrical machine.

28. A method as claimed in claim 27, wherein the or each further excitation signal is at a different frequency to the first excitation signal.

29. A method as claimed in claim 28, wherein the or each further excitation signal has a different amplitude to the first excitation signal.

30. A method as claimed in claim 28, wherein said analysis of the or each of said first and further excitation signals is conducted at substantially the same time.

31. A method as claimed in claim 28, further comprising the step of arranging a power amplifier to control the or each of said at least one second excitation signal in such a way that the corresponding at least one second excitation electric field is maintained at a predetermined level.

32. A method as claimed in claim 27, further comprising the step of generating a variable frequency excitation signal or signals.

* * * * *

UNITED STATES PATENT AND TRADEMARK OFFICE
CERTIFICATE OF CORRECTION

PATENT NO. : 6,903,556 B2 Page 1 of 1
DATED : June 7, 2005
INVENTOR(S) : John Sutton It is certified that error appears in the above-identified patent and that said Letters Patent is hereby corrected as shown below:

<u>Title page,</u>
Item [56], References Cited, OTHER PUBLICATIONS,
"Ridley," reference, change "EL CID test evaluations, 1994-96" to -- "EL CID test evaluations, 1984-94 --.

<u>Column 8,</u>
Line 56, change "to-receive" to -- to receive --.

Signed and Sealed this

Twenty-eighth Day of March, 2006

JON W. DUDAS
*Director of the United States Patent and Trademark Office*